(12) United States Patent
Chang et al.

(10) Patent No.: US 8,765,600 B2
(45) Date of Patent: Jul. 1, 2014

(54) CONTACT STRUCTURE FOR REDUCING GATE RESISTANCE AND METHOD OF MAKING THE SAME

(75) Inventors: Chung-Long Chang, Dou-Li (TW); Chih-Ping Chao, Hsinchu (TW); Chun-Hung Chen, Xinpu Township (TW); Hua-Chao Tseng, Hsinchu (TW); Jye-Yen Cheng, Taichung (TW); Harry-Hak-Lay Chuang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 519 days.

(21) Appl. No.: 12/913,982

(22) Filed: Oct. 28, 2010

(65) Prior Publication Data

US 2012/0104471 A1    May 3, 2012

(51) Int. Cl.
*H01L 21/4763* (2006.01)
*H01L 29/76* (2006.01)

(52) U.S. Cl.
USPC ........... 438/650; 438/620; 438/625; 438/637; 438/642; 257/288

(58) Field of Classification Search
USPC ........... 438/620, 625, 637, 642, 650; 257/288
See application file for complete search history.

(56) References Cited

U.S. PATENT DOCUMENTS

| | | | | |
|---|---|---|---|---|
| 5,506,177 A * | 4/1996 | Kishimoto et al. | ........... | 438/624 |
| 5,721,167 A * | 2/1998 | Subramanian et al. | ....... | 438/238 |
| 5,969,422 A * | 10/1999 | Ting et al. | ...................... | 257/762 |
| 6,465,294 B1 * | 10/2002 | Tsai et al. | ...................... | 438/217 |
| 6,635,536 B2 * | 10/2003 | Shin et al. | ...................... | 438/276 |
| 6,737,310 B2 | 5/2004 | Tsai et al. | | |
| 7,557,025 B2 * | 7/2009 | Shih | .............. | 438/592 |
| 2001/0030350 A1 * | 10/2001 | Oowaki et al. | ................ | 257/410 |
| 2002/0079525 A1 * | 6/2002 | Mayuzumi | ..................... | 257/296 |
| 2004/0104419 A1 * | 6/2004 | Bohr | ............................. | 257/308 |
| 2007/0099414 A1 * | 5/2007 | Frohberg et al. | .............. | 438/618 |
| 2008/0191352 A1 * | 8/2008 | Yu et al. | ........................ | 257/751 |
| 2009/0148677 A1 * | 6/2009 | Edelstein et al. | ............. | 428/209 |
| 2010/0051934 A1 * | 3/2010 | Choung et al. | .................. | 257/43 |
| 2011/0062502 A1 * | 3/2011 | Yin et al. | ....................... | 257/288 |

OTHER PUBLICATIONS

VLSI Research, Inc., "BEOL Wiring Process for CMOS Logic", Feb. 1995, Chip Making Markets.*

* cited by examiner

*Primary Examiner* — Fernando L Toledo
(74) *Attorney, Agent, or Firm* — Lowe Hauptman & Ham, LLP

(57) ABSTRACT

A semiconductor device having a gate on a substrate with source/drain (S/D) regions adjacent to the gate. A first dielectric layer overlays the gate and the S/D regions, the first dielectric layer having first contact holes over the S/D regions with first contact plugs formed of a first material and the first contact plugs coupled to respective S/D regions. A second dielectric layer overlays the first dielectric layer and the first contact plugs. A second contact hole formed in the first and second dielectric layers is filled with a second contact plug formed of a second material. The second contact plug is coupled to the gate and interconnect structures formed in the second dielectric layer, the interconnect structures coupled to the first contact plugs. The second material is different from the first material, and the second material has an electrical resistance lower than that of the first material.

20 Claims, 4 Drawing Sheets

CONTACT STRUCTURE FOR REDUCING GATE RESISTANCE AND METHOD OF MAKING THE SAME

BACKGROUND

The disclosure relates generally to the fabrication of semiconductor devices, and more particularly, to semiconductor devices having contact structures with reduced gate resistance.

Electrically conductive lines providing, for example, signal transfer are essential in electronic devices as well as semiconductor integrated circuit (IC) devices. The conductive lines on different levels are connected through conductive plugs in required positions to provide a predetermined function. Continuing advances in semiconductor manufacturing processes have resulted in semiconductor devices with finer features and/or higher degrees of integration. Among the various features included within a semiconductor device, contact structures typically provide an electrical connection between circuit devices and/or interconnection layers.

A typical semiconductor device having a contact structure has a gate structure on a semiconductor substrate and a source/drain region laterally adjacent to the gate structure in the semiconductor substrate. A contact hole is formed in an interlevel dielectric (ILD) and then filled with a conductive material, for example, a tungsten contact to electrically couple to the gate structure. However, the tungsten plug provides disadvantageously high gate resistance.

It is therefore desirable to provide a semiconductor device having a contact structure and fabrication methods for reducing the gate resistance thereby improving the resistance/capacitance coupling (RC delay).

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes have not been described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, cross-sectional diagrams of FIG. 1A to 1F illustrate an exemplary embodiment of a method of forming a contact structure using a copper plug for electrically coupling the gate electrode layer.

Figure 1A:
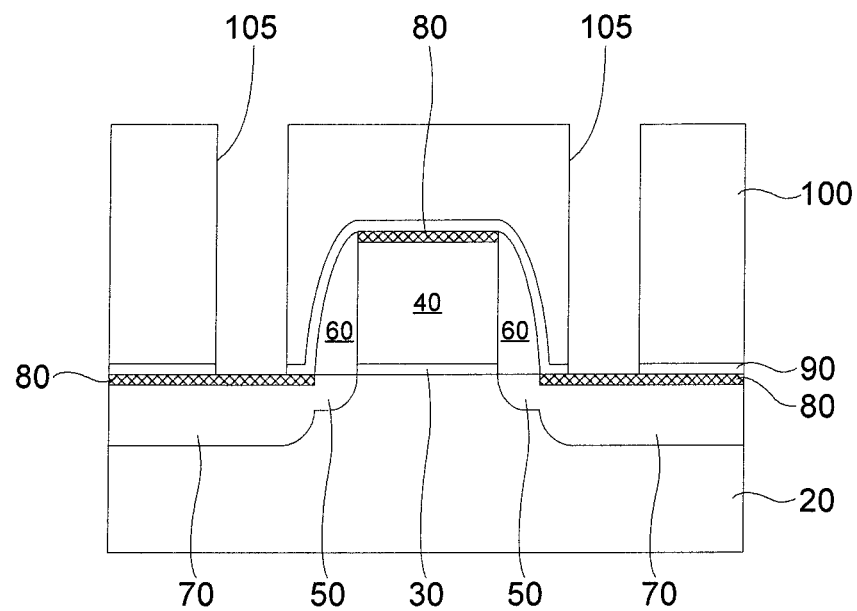
FIG. 1A to FIG. 1F are cross-sectional views illustrating a method of forming a contact structure on a semiconductor device, according to an embodiment.

In FIG. 1A, a gate dielectric material and a gate conductive material deposited on a semiconductor substrate 20 are patterned and respectively become a gate dielectric layer 30 and a gate electrode layer 40, both of which form together as a gate structure. The substrate 20 is bulk silicon, but other commonly used materials and structures such as silicon on insulator (SOI) or a silicon layer overlying a bulk silicon germanium may also be used. The gate dielectric layer 30 may be formed of silicon oxide or a high-k dielectric material. The gate electrode layer 40 may be formed of amorphous polysilicon, doped polysilicon, metal, single crystalline silicon or other conductive materials.

A light ion implantation process is then performed to form two lightly doped regions 50 respectively at each side of the gate structure in the substrate 20. Next, a dielectric spacer 60 is formed on each sidewall of the gate structure. The dielectric spacer 60 may be formed of oxide, nitride, oxynitride, or combinations thereof. A heavy ion implantation process is then performed to form a heavily doped region 70 on the lightly doped region 50. Thus, two source/drain regions 70 with a lightly doped drain (LDD) structure 50 are formed in the substrate 20 at each side of the gate structure. Whether a MOS transistor is nMOS or pMOS will depend on the conductivity type of the substrate 20 and the source/drain regions 70. For pMOS transistors, the LDD structure and the source/drain regions will be p-type and the substrate will be n-type. For nMOS transistors, the LDD structure and the source/drain regions will be n-type and the substrate will be p-type.

In order to reduce sheet resistance, a silicide layer 80 is formed on the source/drain regions 70 and the gate electrode layer 40. The silicide layer 80 is a metal silicide layer comprising metals such as titanium, cobalt, nickel, palladium, platinum, erbium, and the like. In alternative embodiments where resistance and ohmic contact considerations are not so important, such as in high-K metal gate processes, the silicide layer 80 is optional.

A contact etch stop layer (CESL) 90 for controlling the end point during subsequent contact hole formation is deposited on the above-described MOS transistor completed on the substrate 20. The CESL 90 may be formed of silicon nitride, silicon oxynitride, silicon carbide, or combinations thereof. A first inter-layered dielectric (ILD) layer 100 is formed on the CESL 90 so as to isolate the MOS transistor from a subsequent formation of an interconnect structure. The first ILD layer 100 may be a silicon oxide containing layer formed of doped or undoped silicon oxide by a thermal CVD process or high-density plasma (HDP) process, e.g., undoped silicate glass (USG), phosphorous doped silicate glass (PSG) or borophosphosilicate glass (BPSG). Alternatively, the first ILD layer 100 may be formed of doped or P-doped spin-on-glass (SOG), PTEOS, or BPTEOS. Following planarization, e.g., chemical mechanical planarization (CMP) on the first ILD layer 100, a dielectric anti-reflective coating (DARC) and/or a bottom anti-reflective coating (BARC) and a lithographically patterned photoresist layer are provided, which are omitted in the figures for simplicity and clarity. A dry etching process is then carried out to form a first contact hole 105 that passes through the first ILD layer 100 and the CESL 90. In some embodiments that include the silicide layer 80, the etch process exposes the silicide layer 80 positioned over the source/drain region 70. Then the patterned photoresist and the BARC layers are stripped.

Figure 1B:
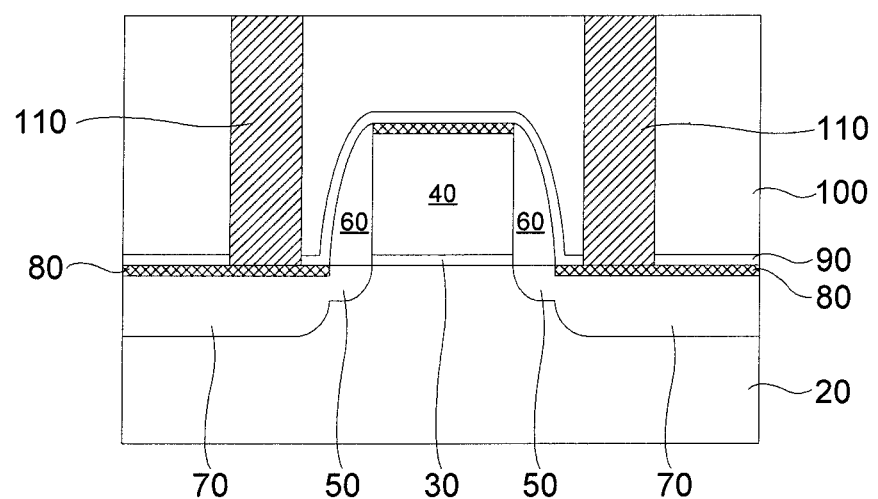

In FIG. 1B, a first conductive layer is deposited over the substrate 20 so that the first contact holes 105 are also filled. Portions of the first conductive layer other than the first contact hole 105 are removed by CMP. The first ILD layer 100 is thereafter exposed and remaining portions of the first conductive layer filling the first contact holes 105 becomes first contact plugs 110. The first contact plug 110 is formed of tungsten or tungsten-based alloy, and also named a tungsten plug 110 hereinafter. One method of forming the tungsten plug 110 includes a selective tungsten chemical vapor deposition (W-CVD) method. For example, tungsten may be deposited essentially only on silicon exposed at the bottom of the first contact hole 105, and overgrowth of tungsten may then be removed with an etch back step.

Figure 1C:
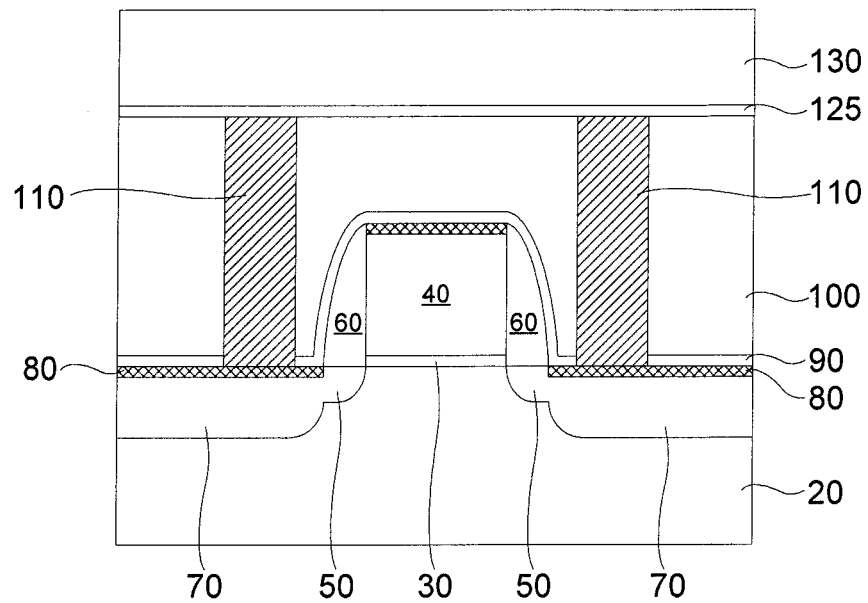

In FIG. 1C, an etch stop layer 125 and a second ILD layer 130 are deposited over the first ILD layer 100. The etch stop layer 125 may be formed of silicon oxide, silicon nitride, silicon carbide, silicon oxynitride or combinations thereof, which may be formed through any of a variety of deposition techniques, including LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures. Although the embodiment illustrate the etch stop layer 125, the present disclosure provides value when omitting the use of the etch stop layer 125 depending on advances in contact formation control.

The second ILD layer 130 may be an inter-metal dielectric (IMD) layer and may be formed through any of a variety of techniques, including, spin coating, CVD, and future-developed deposition procedures. The second ILD layer 130 may be a single layer or a multi-layered structure (with or without an intermediate etch stop layer). In one embodiment, the second ILD layer 130 is formed of a low-k dielectric layer. As used throughout this disclosure, the term "low-k" is intended to define a dielectric constant of a dielectric material of 4.0 or less. A wide variety of low-k materials may be employed in accordance with embodiments, for example, spin-on inorganic dielectrics, spin-on organic dielectrics, porous dielectric materials, organic polymer, organic silica glass, fluorinated silicate glass (FSG), diamond-like carbon, HSQ (hydrogen silsesquioxane) series material, MSQ (methyl silsesquioxane) series material, porous organic series material, polyimides, polysilsesquioxanes, polyarylethers, fluoro-silicate glass, and commercial materials such as FLARE™ from Allied Signal or SiLK™ from Dow Corning, and other low-k dielectric compositions.

Figure 1D:
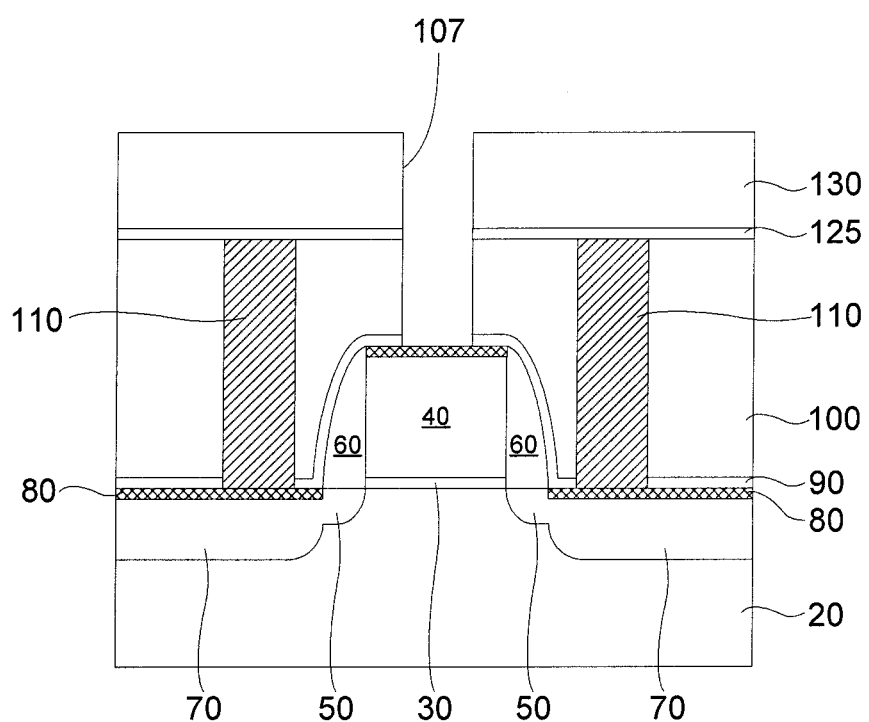

In FIG. 1D, a dry etching process is then carried out to form a second contact hole 107 that passes through the second ILD layer 130, the etch stop layer 125, the first ILD layer 100, and the contact etch stop layer 90. In some embodiments that include the silicide layer 80, the etch process exposes the silicide layer 80 positioned above the gate electrode layer 40.

Figure 1E:
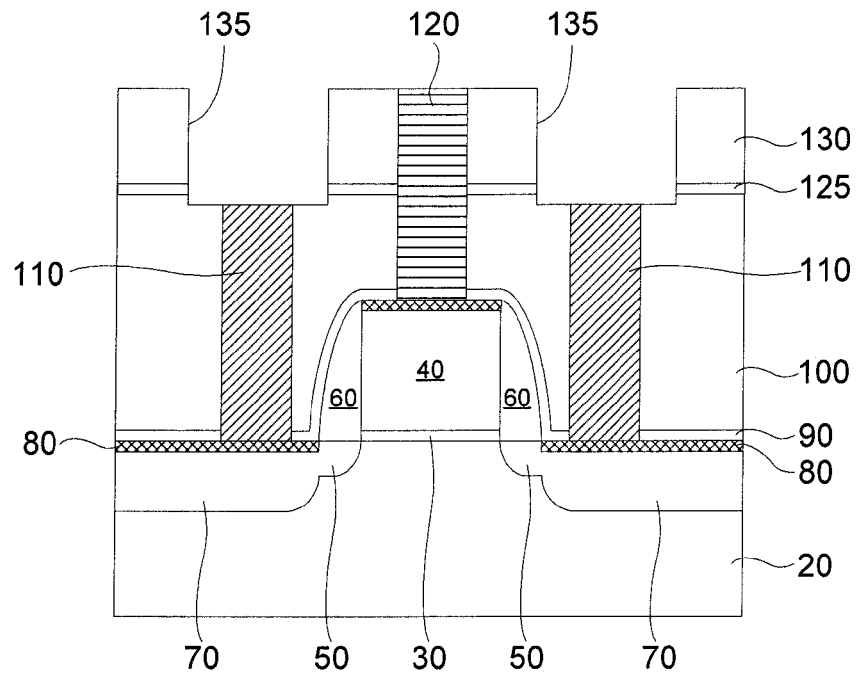

With reference now to FIG. 1E, a second conductive layer is deposited over the substrate 20 so that the second contact hole 107 is also filled. Portions of the second conductive layer other than the second contact hole 107 are removed by CMP. The second ILD layer 130 is thereafter exposed and a remaining portion of the second conductive layer filling the second contact hole 107 becomes a second contact plug 120. The second contact plug 120 also named a copper plug 120 electrically couples the gate electrode layer 40. The copper plug 120 may include a low resistivity conductor material selected from the group of conductor materials including, but is not limited to, copper and copper-based alloy, gold, gold alloy, silver, and silver alloy. One method of forming the copper plug 120 includes using a copper-fill process that includes metal seed layer deposition and copper electrochemical plating. The metal seed layer may include copper, nickel, molybdenum, platinum, or the like by means of PVD, CVD, or ALD methods.

Following the formation of the second contact plug 120, third contact holes 135 are formed substantially in second ILD layer 130. The third contact holes 135 may be a single damascene opening or a dual-damascene opening formed using typical lithographic with masking technologies and anisotropic etch operation (e.g., plasma etching or reactive ion etching).

Figure 1F:
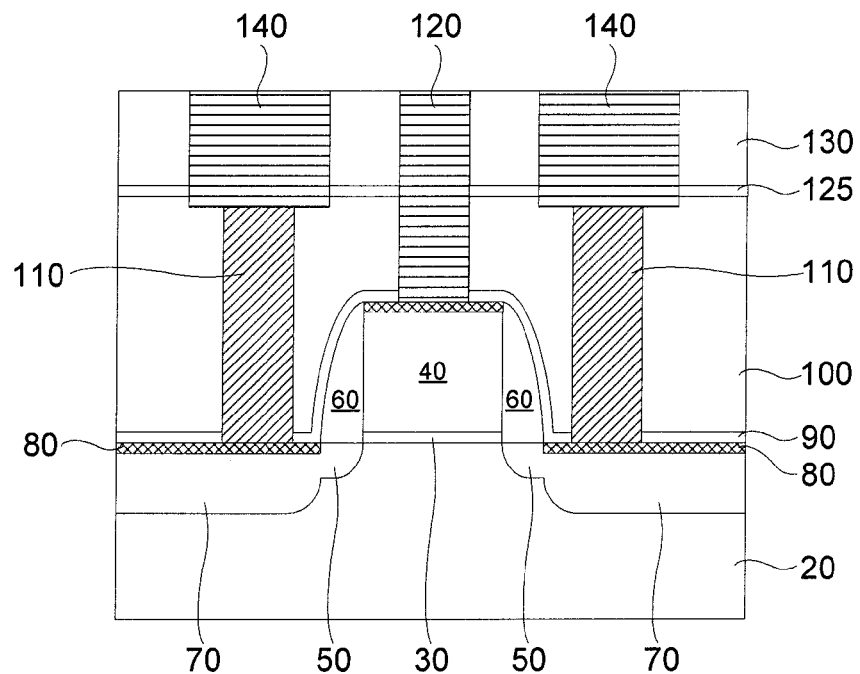

In FIG. 1F, a third conductive layer is then deposited over the substrate 20 in third contact holes 135. Portions of the third conductive layer are then planarized to form interconnect structures 140 electrically coupled to the respective tungsten plugs 110. Interconnect structure 140 may include a low resistivity conductor material selected from the group of conductor materials including, but is not limited to, copper and copper-based alloy, gold, gold alloy, silver, and silver alloy.

Figure 2A:
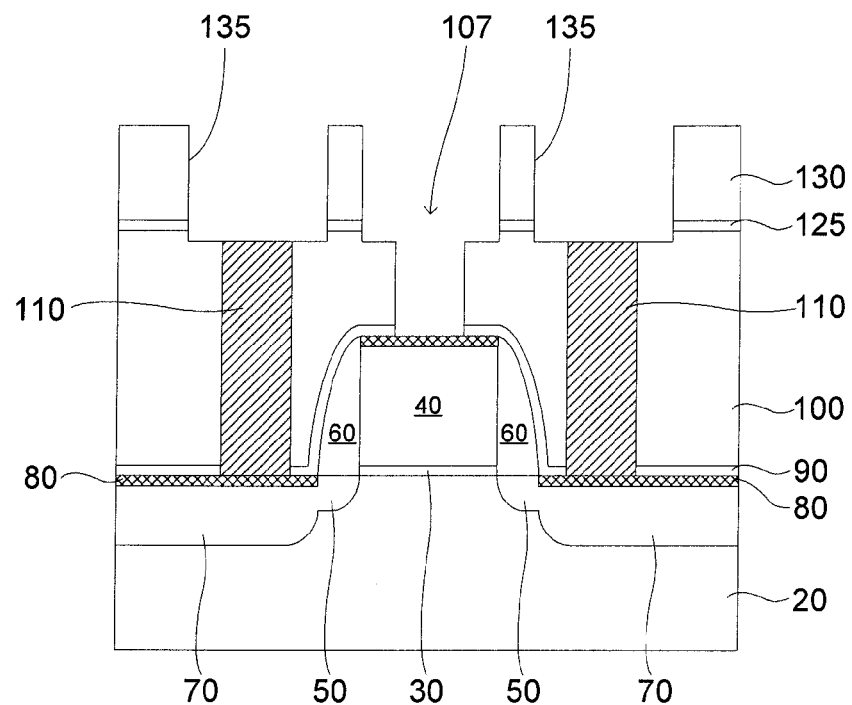
FIGS. 2A-2B are cross-sectional views illustrating a method of forming a contact structure on a semiconductor device, according to another embodiment.
Figure 2B:
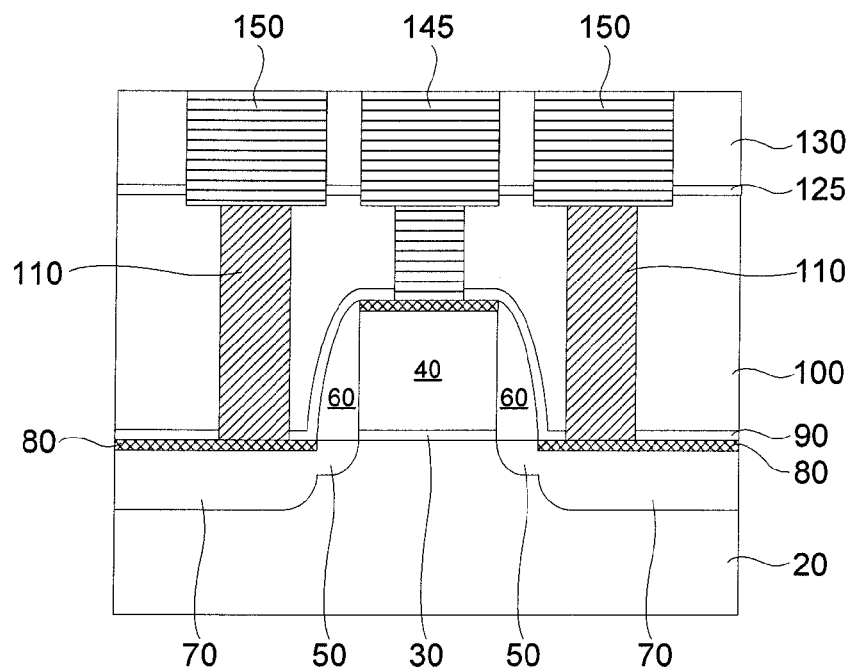

FIGS. 2A to 2B illustrate an exemplary embodiment of another method of forming a contact structure using a copper plug for electrically coupling the gate electrode layer. Following the formation of the second contact hole 107 as shown in FIG. 1D, FIG. 2A shows a single damascene opening or a dual-damascene opening formed substantially in the second dielectric layer 130 and above the second contact hole 107 using typical lithographic with masking technologies and anisotropic etch operation (e.g., plasma etching or reactive ion etching). As shown in FIG. 2B, a conductive layer is then deposited over the substrate 20 in third contact holes 135 and second contact hole 107. Portions of the conductive layer are then planarized to form interconnect structures 150 electrically coupled to the respective tungsten plugs 110 and interconnect structure 145 electrically coupled to the gate electrode layer 40. Interconnect structures 150 and 145 may include a low resistivity conductor material selected from the group of conductor materials including, but is not limited to, copper and copper-based alloy, gold, gold alloy, silver, and silver alloy.

Embodiments of the semiconductor device having a contact structure have been described. The contact structure reduces the gate resistance because second contact plugs 120 includes a material having lower electrical resistance than tungsten, such as copper and copper-based alloy, gold, gold alloy, silver, and silver alloy.

In the preceding detailed description exemplary embodiments are described. It will, however, be evident that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the invention as expressed herein.

What is claimed is:

1. A semiconductor device, comprising:
   a gate structure on a semiconductor substrate;
   source/drain regions laterally adjacent to the gate structure in the semiconductor substrate;
   a first dielectric layer overlying the gate structure and the source/drain regions, wherein the first dielectric layer has first contact holes over the source/drain regions;

first contact plugs formed of a first conductive material filling the first contact holes, wherein the first contact plugs are electrically coupled to the respective source/drain regions;

a second dielectric layer overlaying the first dielectric layer and the first contact plugs;

a second contact hold formed in the first and the second dielectric layers;

a second contact plug formed of a second conductive material filling the second contact hole at least in the first dielectric layer, wherein the second contact plug is electrically coupled to the gate structure; and interconnect structures formed substantially in the second dielectric layer, the interconnect structures electrically couple to the first contact plugs;

wherein the second conductive material is different from the first conductive material, and the second conductive material has an electrical resistance lower than that of the first conductive material;

wherein the second contact hole and the second contact plug formed of the second conductive material extend continuously from the first dielectric layer to the second dielectric layer.

2. The semiconductor device of claim 1, wherein the first conductive material comprising at least one of tungsten of tungsten-based alloy.

3. The semiconductor device of claim 1, wherein the second conductive material comprises at least one of copper or copper-based alloy.

4. The semiconductor device of claim 1, wherein the interconnect structures are formed of the second conductive material.

5. The semiconductor device of claim 1, further comprising an etch stop layer between the first dielectric layer and the second dielectric layer.

6. The semiconductor device of claim 1, further comprising a silicide layer on the gate structure and the source/drain regions, wherein the first contact holes expose the silicide layer on the source/drain regions.

7. The semiconductor device of claim 6, further comprising a contact etch stop layer between the first dielectric layer and the silicide layer, wherein the first contact holes pass through the first dielectric layer and the contact etch stop layer to expose the silicide layer.

8. The semiconductor device of claim 6, further comprising a contact etch stop layer overlying the gate structure, wherein the second contact hole passes through the first and second dielectric layers and the contact etch stop layer to expose the silicide layer.

9. A semiconductor device, comprising:
a gate structure on a semiconductor substrate;
source/drain regions laterally adjacent to the gate structure in the semiconductor substrate;
a first dielectric layer overlying the gate structure and the source/drain regions, wherein the first dielectric layer has first contact holes over the source/drain regions;
first contact plugs formed of a first conductive material filling the first contact holes, wherein the first contact plugs are electrically coupled to the respective source/drain regions;
a second dielectric layer overlaying the first dielectric layer and the first contact plugs;
a second contact hole formed in the first and the second dielectric layers;
a second contact plug formed of a second conductive material filling the second contact hole substantially in the first dielectric layer, wherein the second contact plug is electrically coupled to the gate structure;
a first interconnect structure formed substantially in the second dielectric layer, the first interconnect structure electrically coupled to the second contact plug; and
second interconnect structures formed substantially in the second dielectric layer electrically coupled to the first contact plugs;
wherein the second conductive material is different from the first conductive material, and the second conductive material has an electrical resistance lower than that of the first conductive material;
wherein the second contact hole and the second contact plug formed of the second conductive material extend continuously from the first dielectric layer to the second dielectric layer.

10. The semiconductor device of claim 9, wherein the first conductive material comprises at least one of tungsten or tungsten-based alloy.

11. The semiconductor device of claim 9, wherein the second conductive material comprises at least one of copper or copper-based alloy.

12. The semiconductor device of claim 9, wherein the first and second interconnect structures are formed of the second conductive material.

13. The semiconductor device of claim 9, further comprising an etch stop layer between the first dielectric layer and the second dielectric layer.

14. The semiconductor device of claim 9, further comprising a silicide layer on the gate structure and the source/drain regions, wherein the first contact holes expose the silicide layer on the source/drain regions.

15. The semiconductor device of claim 14, further comprising a contact etch stop layer between the first dielectric layer and the silicide layer, wherein the first contact holes pass through the first dielectric layer and the contact etch stop layer to expose the silicide layer.

16. The semiconductor device of claim 14, further comprising a contact etch stop layer overlying the gate structure, wherein the second contact hole passes through the first and second dielectric layers and the contact etch stop layer to expose the silicide layer.

17. A method of forming a semiconductor device, comprising:
forming a gate structure on a semiconductor substrate;
forming source/drain regions laterally adjacent to the gate structure in the semiconductor substrate;
depositing a first dielectric layer over the gate structure and the source/drain regions, wherein the first dielectric layer has first contact holes over the source/drain regions;
depositing a first conductive material in the first contact holes to form first contact plugs, wherein the first contact plugs are electrically coupled to the respective source/drain regions;
depositing a second dielectric layer over the first dielectric layer and the first contact plugs;
forming a second contact hole in the first and second dielectric layers;
depositing a second conductive material in the second contact hole in at least the first dielectric layer to form a second contact plug, wherein the second contact plug is electrically coupled to the gate structure; and
forming interconnect structures substantially in the second dielectric layer, the interconnect structures electrically coupled to the first contact plugs;

wherein the second conductive material is different from the first conductive material, and the second conductive material has an electrical resistance lower than that of the first conductive material;

wherein the second contact hole and the second contact plug formed of the second conductive material extend continuously from the first dielectric layer to the second dielectric layer.

18. The method of claim 17, wherein the first conductive material comprises at least one of tungsten or tungsten-based alloy.

19. The method of claim 17, wherein the second conductive material comprises at least one of copper or copper-based alloy.

20. The method of claim 19, wherein the interconnect structures is formed of the second conductive material.

\* \* \* \* \*